United States Patent
Jeon

(10) Patent No.: US 10,028,371 B2
(45) Date of Patent: Jul. 17, 2018

(54) HEAT RADIATION MEMBER, HEAT RADIATION CIRCUIT BOARD, AND HEAT EMISSION DEVICE PACKAGE

(71) Applicant: LG INNOTEK CO., LTD., Seoul (KR)

(72) Inventor: Sung Ho Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 157 days.

(21) Appl. No.: 14/426,223

(22) PCT Filed: Sep. 9, 2013

(86) PCT No.: PCT/KR2013/008108
§ 371 (c)(1),
(2) Date: Mar. 5, 2015

(87) PCT Pub. No.: WO2014/038899
PCT Pub. Date: Mar. 13, 2014

(65) Prior Publication Data
US 2015/0257250 A1    Sep. 10, 2015

(30) Foreign Application Priority Data
Sep. 7, 2012    (KR) .................. 10-2012-0099631

(51) Int. Cl.
*H05K 7/20*    (2006.01)
*H05K 1/02*    (2006.01)
*H01L 23/367*    (2006.01)

(52) U.S. Cl.
CPC ....... *H05K 1/0203* (2013.01); *H01L 23/3672* (2013.01); *H05K 1/0209* (2013.01);
(Continued)

(58) Field of Classification Search
CPC .... H05K 1/0204; H05K 1/0209; H05K 3/284; H05K 2201/0133; H05K 2201/0162; H05K 2201/06
(Continued)

(56) References Cited

U.S. PATENT DOCUMENTS 3,212,569 A * 10/1965 McAdam ................. F28F 1/26
                                                       165/185
4,054,901 A * 10/1977 Edwards ............. H01L 23/4093
                                                       165/80.3
(Continued)

FOREIGN PATENT DOCUMENTS

CN        1822759 A     8/2006
CN        201063965 Y   5/2008
(Continued)

OTHER PUBLICATIONS

TIPO Office Action for Taiwanese Patent Application No. 102132374, dated Jul. 24, 2015, which corresponds to the above-identified U.S. application.
(Continued)

*Primary Examiner* — Sherman Ng
*Assistant Examiner* — Matt Dhillon
(74) *Attorney, Agent, or Firm* — LRK Patent Law Firm

(57) ABSTRACT

A heat radiation member, a heat radiation circuit board, and a heat emission device package are provided. The heat radiation circuit board includes a printed circuit board in which a heat radiation region is defined, and a heat radiation member inserted into the heat radiation region and including a bottom surface attached to the heat radiation region and a lateral surface bent from the bottom surface to pass through the printed circuit board. The heat radiation member is inserted into a region of the heat radiation circuit board adjacent to the heat emission device so that the heat radiation
(Continued)

effect is improved. The heat radiation member having the spatial structure is formed to obtain the superior heat radiation effect. The structure of the heat radiation member is simplified so that the heat radiation member is automatically assembled, thereby reducing the failure of the heat radiation member.

9 Claims, 7 Drawing Sheets

(52) U.S. Cl.
CPC ............. *H01L 2924/0002* (2013.01); *H05K 2201/066* (2013.01)
(58) Field of Classification Search
USPC .................................................. 361/720, 700
See application file for complete search history.

(56) References Cited

U.S. PATENT DOCUMENTS

| | | | | |
|---|---|---|---|---|
| 4,588,028 A * | 5/1986 | Marshall | ............. | H01L 23/3672 165/185 |
| 4,605,058 A * | 8/1986 | Wilens | ............. | H01L 23/4093 165/185 |
| 4,625,260 A * | 11/1986 | Jordan | ............. | H01L 23/4093 228/180.21 |
| 4,720,771 A * | 1/1988 | Horton | ............. | H01L 23/4006 165/185 |
| 4,753,290 A * | 6/1988 | Gabuzda | ............. | H01L 23/3672 165/185 |
| 4,847,449 A * | 7/1989 | Jordan | ............. | H01L 23/4093 174/138 G |
| 5,311,395 A * | 5/1994 | McGaha | ............. | H01L 23/3672 165/185 |
| 5,365,399 A * | 11/1994 | Kent | ............. | H01L 23/3672 165/185 |
| 5,597,034 A * | 1/1997 | Barker, III | ............. | H01L 23/467 165/121 |
| 5,844,312 A * | 12/1998 | Hinshaw | ............. | H01L 23/4093 257/718 |
| 5,914,859 A * | 6/1999 | Takada | ............. | H01L 23/36 174/252 |
| 5,917,701 A * | 6/1999 | Solberg | ............. | H01L 23/4093 257/E23.086 |
| 5,930,114 A * | 7/1999 | Kuzmin | ............. | H01L 23/4093 165/80.2 |
| 6,053,240 A * | 4/2000 | Johnston | ............. | H01L 23/367 165/185 |
| 6,178,628 B1 * | 1/2001 | Clemens | ............. | H01L 23/3672 228/124.6 |
| 6,320,748 B1 * | 11/2001 | Roden | ............. | H01L 23/367 165/185 |
| 6,722,423 B1 * | 4/2004 | Wei | ............. | H01L 23/467 165/185 |
| 7,142,428 B2 * | 11/2006 | Vackar | ............. | H01L 23/4093 257/E23.086 |
| 7,333,335 B2 * | 2/2008 | Hsieh | ............. | H01L 23/40 257/E23.083 |
| 7,462,934 B2 * | 12/2008 | Reents | ............. | H01L 23/4006 257/707 |
| 7,593,235 B2 * | 9/2009 | Espino | ............. | H01L 23/3672 174/262 |
| 2002/0131238 A1 * | 9/2002 | Fisher | ............. | H01L 23/3672 361/719 |
| 2004/0252457 A1 | 12/2004 | Hsieh et al. | | |
| 2005/0140741 A1 | 6/2005 | Kubo | | |
| 2005/0180116 A1 * | 8/2005 | Yamanaka | ............. | H01L 23/367 361/718 |
| 2006/0187643 A1 | 8/2006 | Tsurufusa | | |
| 2008/0068805 A1 * | 3/2008 | Xu | ............. | H01L 23/4093 361/710 |
| 2008/0123296 A1 * | 5/2008 | Chen | ............. | H01L 23/427 361/700 |
| 2008/0190653 A1 | 8/2008 | Tageman et al. | | |
| 2008/0283234 A1 * | 11/2008 | Sagi | ............. | H01L 23/3672 165/182 |
| 2011/0222246 A1 | 9/2011 | Hsieh et al. | | |
| 2014/0292176 A1 * | 10/2014 | Athalye | ............. | F21V 29/70 313/46 |
| 2014/0321126 A1 * | 10/2014 | Narag | ............. | H05K 1/189 362/306 |

FOREIGN PATENT DOCUMENTS

| | | |
|---|---|---|
| CN | 202206709 U | 4/2012 |
| JP | 2001-244672 A | 9/2001 |
| JP | 2008-538860 A | 11/2008 |
| TW | I225767 B | 12/2004 |

OTHER PUBLICATIONS

Search Report for International Application No. PCT/KR2013/008108.
SIPO Office Action for Chinese Application No. 201380046703.1 which corresponds to the above-identified U.S application.

* cited by examiner

[Fig. 1]
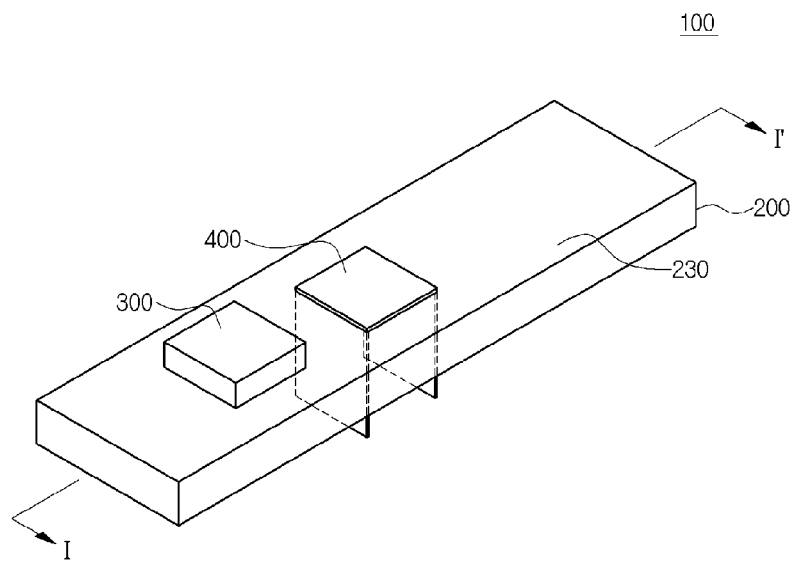
[Fig. 2]
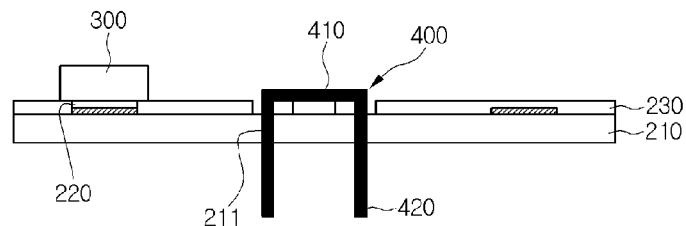
[Fig. 3]
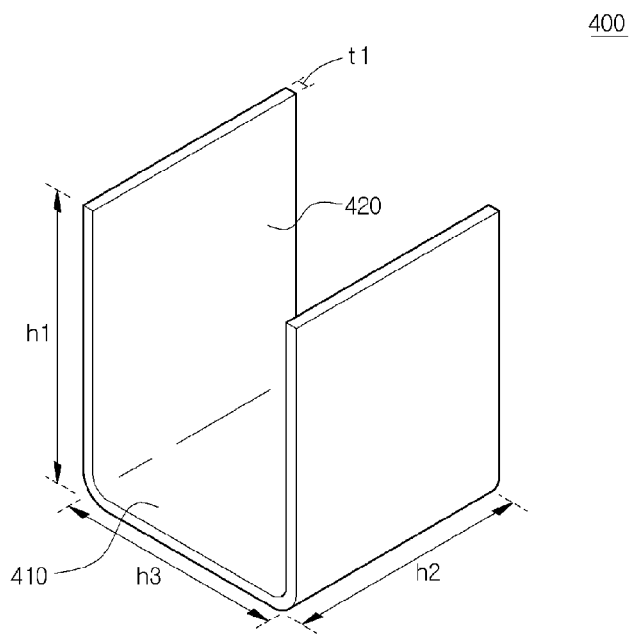

[Fig. 4]
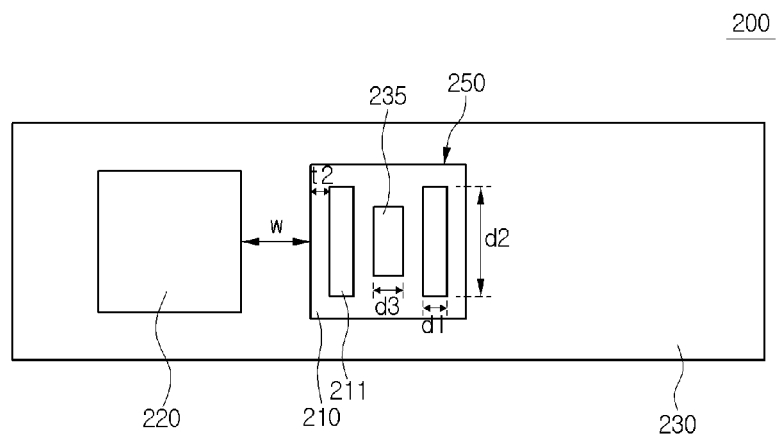
[Fig. 5]
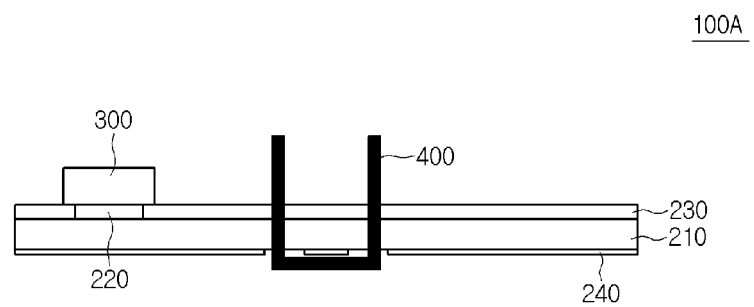
[Fig. 6a]
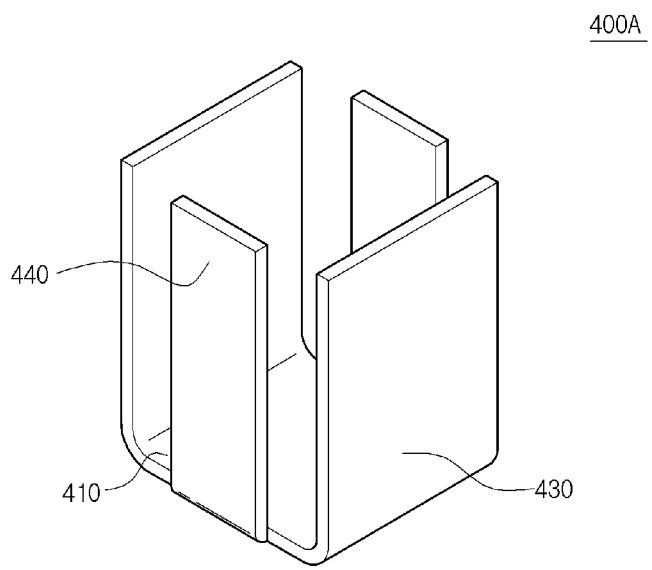

[Fig. 6b]
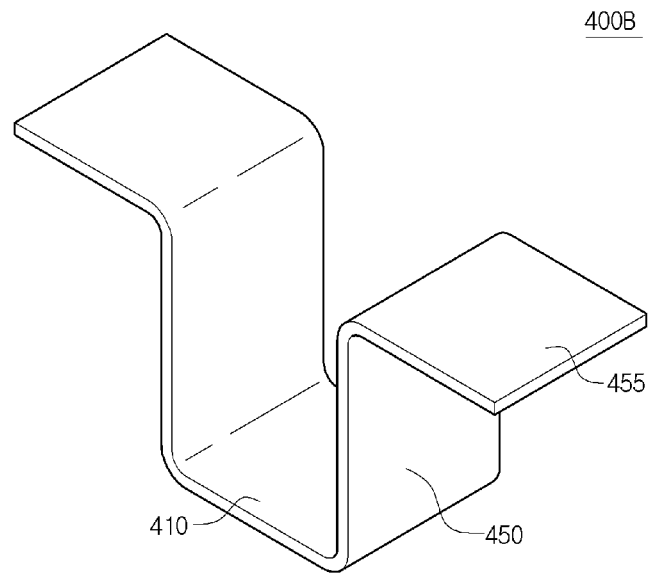
[Fig. 6c]
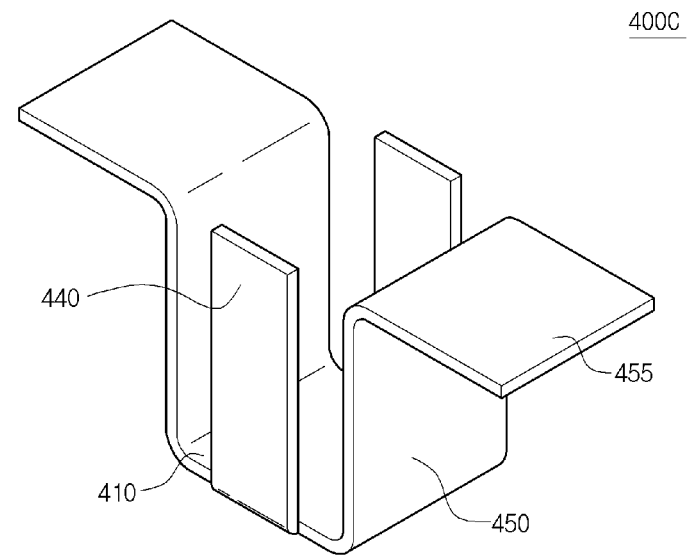

[Fig. 7a]
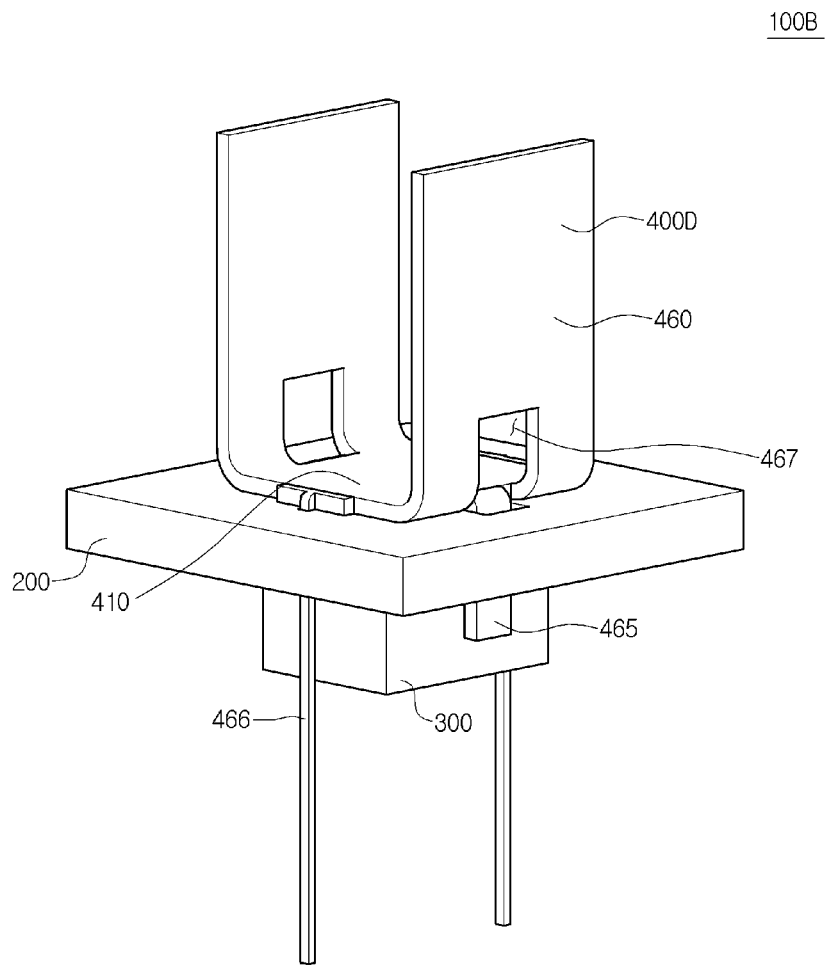

[Fig. 7b]
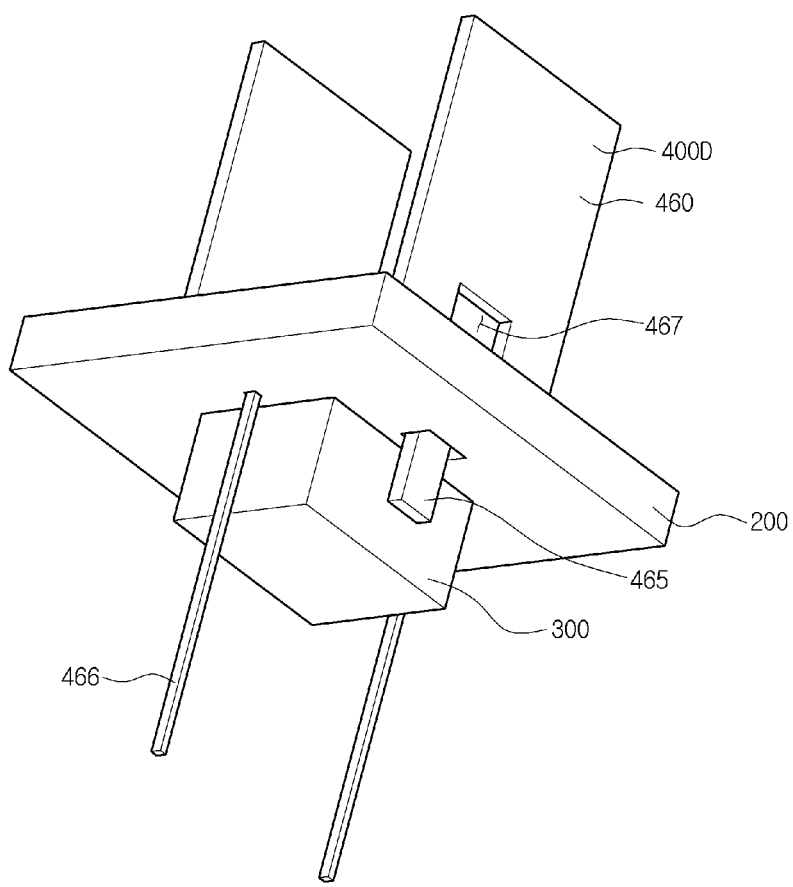

[Fig. 8a]
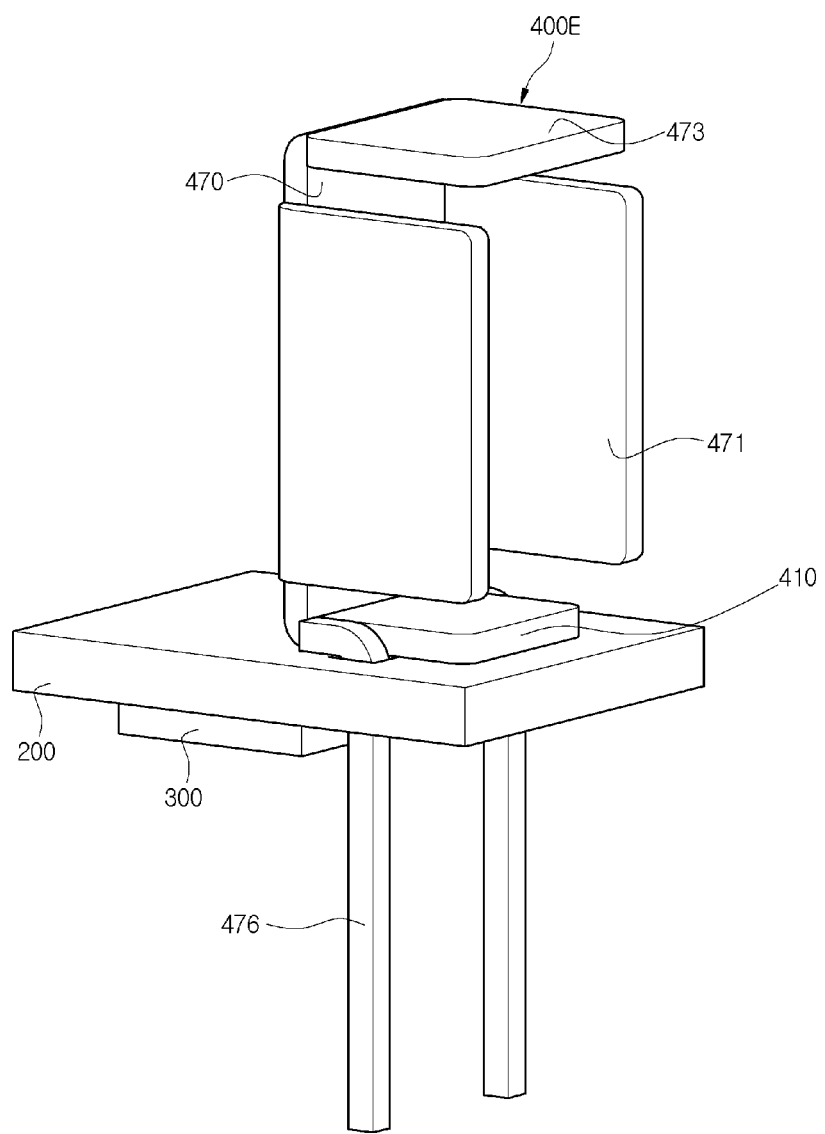

[Fig. 8b]
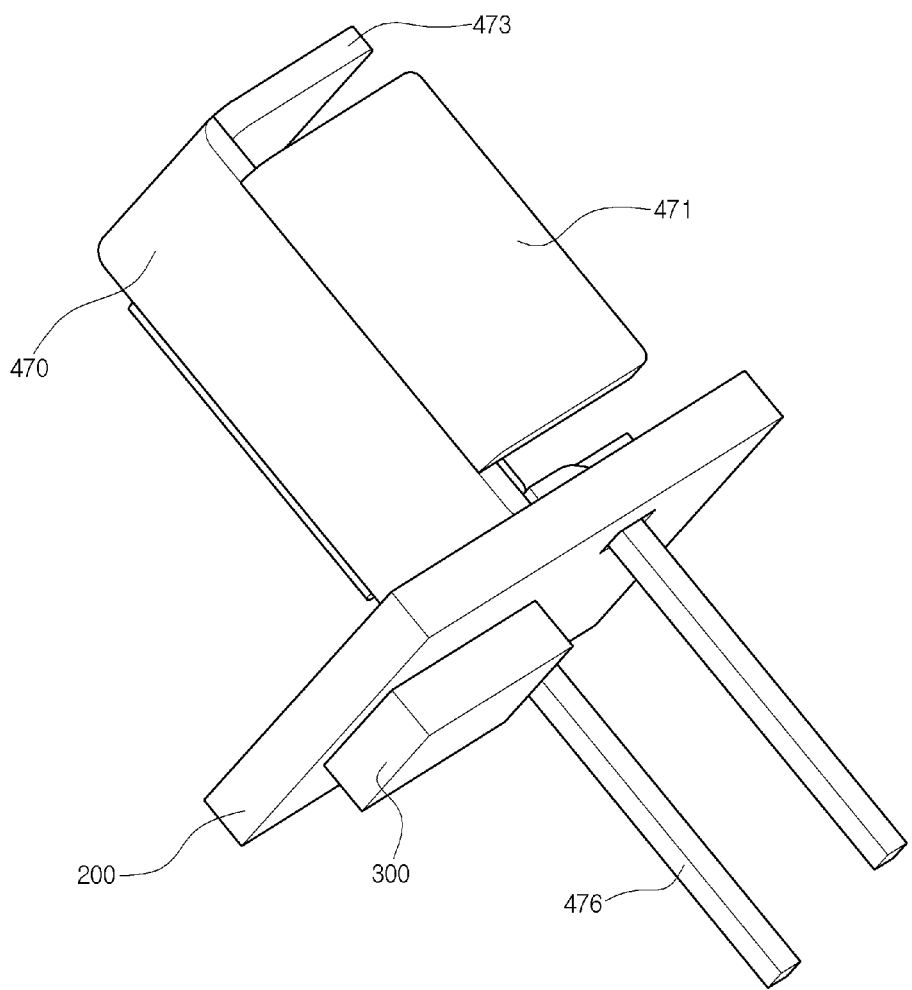

HEAT RADIATION MEMBER, HEAT RADIATION CIRCUIT BOARD, AND HEAT EMISSION DEVICE PACKAGE

TECHNICAL FIELD

The disclosure relates to a heat radiation member, a heat radiation circuit board, and a heat emission device package.

BACKGROUND ART

In a heat emission device package in which a high-heat emission device such as a power product is installed, heat radiation is an important issue.

For example, the heat emission device may include a light emitting diode (LED) or a power unit. The heat emission device emits a significant amount of heat. The heat radiated from the heat emission device increases the temperature of a circuit board so that the heat emission device may be erroneously operated and the problems may occur in the reliability of the heat emission device.

A heat sink is suggested to solve the problem caused by the radiant heat.

A heat radiation power board according to the related art is mounted thereon with power units distributed on a circuit board to product power, and a plurality of heat sinks are provided around the power units.

The heat sinks are distributed around the power units, and include an alloy material containing aluminum (Al) representing high thermal conductivity.

In this case, the heat sink is forcibly inserted or attached to the circuit board through a soldering process.

However, according to the application of the heat sink, the processing cost for forcible insertion of the heat sink is significantly required. If the area of the heat sink is increased, the size of the circuit board is increased, so that the material cost is increased.

In addition, if four to five heat sinks are used with respect to each circuit board, the price, the mold cost, and the assembling cost are increased.

Further, when the soldering process is performed, the delamination failure occurs due to the large area of the heat sink. In the case of the insertion failure, the copper foil for a circuit pattern is damaged, and a portion of fixing leads of the heat sink may not be inserted.

DISCLOSURE OF INVENTION

Technical Problem

The embodiment provides a heat radiation member, a heat radiation circuit board, and a heat emission device package, which have novel structures.

The embodiment provides a heat radiation member, a heat radiation circuit board, and a heat emission device package, which can represent improved thermal efficiency.

Solution to Problem

According to the embodiment, there is provided a heat radiation member including a bottom surface provided at a top surface of a circuit board and a lateral surface bent from the bottom surface.

According to the embodiment, there is provided a heat radiation circuit board including a printed circuit board in which a heat radiation region is defined, and a heat radiation member inserted into the heat radiation region and including a bottom surface attached to the heat radiation region and a lateral surface bent from the bottom surface to pass through the printed circuit board.

According to the embodiment, there is provided a heat emission device package including a heat emission device, a printed circuit board mounted thereon with the heat emission device and having a heat radiation region defined around the heat emission device, and a heat radiation member inserted into the heat radiation region and comprising a bottom surface attached to the heat radiation region and a lateral surface bent from the bottom surface to pass through the printed circuit board.

Advantageous Effects of Invention

As described above, according to the embodiment, the heat radiation member is inserted into a region of the heat radiation circuit board adjacent to the heat emission device so that the heat radiation effect can be improved.

In addition, the heat radiation member having the spatial structure is formed to obtain the superior heat radiation effect. The structure of the heat radiation member is simplified so that the heat radiation member is automatically assembled, thereby reducing the failure of the heat radiation member.

BRIEF DESCRIPTION OF DRAWINGS

FIG. 1 is a perspective view showing a heat emission device package according to a first embodiment.

FIG. 2 is a sectional view taken along line I-I' of the heat emission device package of FIG. 1.

FIG. 3 is an enlarged perspective view showing a heat radiation member of FIG. 1.

FIG. 4 is a top view showing the heat radiation circuit board of FIG. 1.

FIG. 5 is a sectional view showing a heat emission device package according to the second embodiment.

FIGS. 6a to 6c show various applications of the heat radiation member.

FIGS. 7a and 7b are perspective views showing a heat emission device package according to the third embodiment.

FIGS. 8a and 8b are perspective views showing a heat emission device package according to the fourth embodiment.

MODE FOR THE INVENTION

Hereinafter, embodiments will be described in detail with reference to accompanying drawings so that those skilled in the art can easily work with the embodiments. However, the embodiments may not be limited to those described below, but have various modifications.

In the following description, when a predetermined part "includes" a predetermined component, the predetermined part does not exclude other components, but may further include other components unless otherwise indicated.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, a region, or a plate is referred to as being "on" or "under" another layer, another film, another region, or another plate, it can be "directly" or "indirectly" on the other layer (or film), region, plate, or one or more intervening layers may also be present.

According to the present invention, a heat radiation member is applied to a heat emission device package for the purpose of heat radiation.

Hereinafter, the heat emission device package according to the first embodiment will be described with respect to FIGS. 1 to 4.

FIG. 1 is a perspective view showing a heat emission device package according to a first embodiment, and FIG. 2 is a sectional view taken along line I-I' of the heat emission device package of FIG. 1. FIG. 3 is an enlarged perspective view showing a heat radiation member of FIG. 1, and FIG. 4 is a top view showing the heat radiation circuit board of FIG. 1.

Referring to FIGS. 1 to 4, a heat emission device package 100 according to the first embodiment includes a heat radiation circuit board 200, heat emission device 300 on the heat radiation circuit board 200 and a heat radiation member 400.

The heat emission device 300 includes a device to emit heat in driving, and may be a light emitting device such as a light emitting diode or a power device to generate power.

On the heat radiation circuit board 200, a plurality of heat emission devices 300 may be provided, and the heat radiation member 400 is provided in adjacent to each heat emission device 300.

The heat radiation member 400 includes a metallic material and has a bending surface.

The heat radiation member 400 may include steels such as a steel plate cold commercial (SPCC) material, or electrolytic galvanized iron (EGI) or an alloy material including copper (Cu) representing high thermal conductivity and a low price. In addition, the heat radiation member 400 may include metal allowing plating or soldering.

The heat radiation member 400 may be provided on the surface thereof with a plating layer, and the plating layer may include a metallic material, such as copper/zinc or copper/nickel, allowing soldering.

The heat radiation member 400 may have the shape shown in FIG. 3.

Referring to FIG. 3, the heat radiation member 400 is provided along an axis perpendicular to a heat radiation circuit board, and includes a bottom surface 410 and two blades 420 bent from two sides of the bottom surface 410 in opposition to each other.

The heat radiation member 400 has the thickness of 0.3 mm to 0.6 mm, and, preferably, has the thickness of 0.5 mm. If the thickness of the heat radiation member 400 is equal to or thicker than 0.3 mm, the heat radiation effect of the heat emission device 300 can be improved. In addition, if the thickness of the heat radiation member 400 is equal to less than 0.6 mm, the heat emission device package 100 is maintained with a thin thickness while the superior heat radiation effect can be represented.

The bottom surface 410 may have the shape of a square, preferably, the shape of a rectangle. In detail, the bottom surface 410 may have the shape of the rectangle having a length of 8 mm at one side h2 and a length of 6 mm at another side h3. In other words, when the area of the bottom surface 410 is 6?8 mm2, the area of the bottom surface 410 occupying on the heat radiation circuit board 200 can be minimized while the heat radiation effect can be maximized.

In this case, the two blades 420 bent from two long sides of the bottom surface 410 may have the length h1 in the range of 7 mm to 8 mm, preferably, the length h1 of 7.8 mm.

The bending sides between the bottom surface 410 and the blades 420 may have a curvature.

As shown in FIG. 1, in the heat radiation member 400, the blades 420 are fixedly inserted into the heat radiation circuit board 200.

Therefore, a plurality of heat radiation members 400 are inserted into peripheral portions of the heat emission device 300 without an additional heat sink, so that the heat can be radiated from the heat emission device 300 to the outside.

The heat radiation circuit board 200 includes a printed circuit board, and includes an insulating plate 210, a base pad 220 connected to a circuit pattern formed on the insulating plate 210, and a solder resist 230 to cover the circuit pattern.

Although the insulating plate 210 may be a support substrate of the heat radiation circuit board 200 having a single circuit pattern therein, the insulating plate 210 may refer to an insulating layer region in which one circuit pattern (not shown) of a printed circuit board having a plurality of lamination structure is formed.

The insulating plate 210 may include a thermosetting polymer substrate, a thermoplastic polymer substrate, a ceramic substrate, an organic-inorganic hybrid substrate, or an impregnated fiberglass substrate. If the insulating plate 210 includes the polymer resin, the insulating plate 210 may include epoxy-based insulating resin. Alternately, the insulating plate 210 may include polyimides resin.

The insulating plate 210 is provided thereon with a plurality of base pads 220 connected with a plurality of circuit patterns. The base pad 220 may have a solder (not shown) which is attached thereto and serves as a bump to mount devices on the printed circuit board 200.

The circuit pattern and the base pad 220 may include a conductive material, and may be formed by simultaneously patterning a copper foil layer formed on the insulating plate 210. Accordingly, the circuit pattern and the base pad 220 may include an alloy including copper (Cu).

The top surface and the lateral surfaces of the base pad 220 may be subject to surface treatment.

The insulating plate 210 is formed thereon with the solder resist 230 to cover the circuit pattern.

The solder resist 230 protects the surface of the insulating plate 210. The solder resist 230 is formed on the front surface of the insulating plate 210, and has an opening to open the top surface of the lamination structure of the base pad 220 to be exposed.

A heat radiation region 250 is defined on the top surface of the heat radiation circuit board 200 in adjacent to the base pad 220 as shown in FIG. 4.

The heat radiation region 250 is a region in which the heat radiation member 400 is mounted.

The heat radiation region 250 has the shape corresponding to that of the bottom surface 410 of the heat radiation member 400, preferably, has the shape of a rectangle. The heat radiation region 250 may have an area wider than that of the bottom surface 410 of the heat radiation member 400. In detail, the heat radiation region 250 may have the area of 9.9 mm when the bottom surface 410 of the heat radiation member 400 has the area of 8.6 mm.

In the heat radiation region 250, a copper foil layer having a circuit pattern at the lower portion thereof is open by removing the solder resist 230.

The open copper layer in the heat radiation region 250 is connected with the base pad 220 to directly discharge heat emitted from the heat emission device 200.

The heat radiation region 250 is provided at the central portion thereof with a central island 235 in which the solder resist 230 remains, thereby preventing the bottom surface 410 from being agglomerated due to the soldering.

The central island 235 is a region to which an adhesive for the bonding with the heat radiation member 400 is applied. The central island 235 has no copper foil layer at the lower portion thereof thereby preventing heat from being concentrated onto the central island 235 so that the adhesive does not flow down.

The central island 235 has an area of 3.2 (d3)×4.8 mm.

Blade holes 211 are formed at both sides of the central island 235 so that the blades 420 of the heat radiation member 400 are inserted into the blade holes 211.

The blade holes 211 have the shapes corresponding to the shapes of the sectional surfaces of the blades 420 of the heat radiation member 400. When the thickness of the heat radiation member 400 is 0.5 mm, the blade holes 211 have the shape of a rectangle having a width d1 in the range of 1.0 mm to 1.5 mm, preferably, 1.3 mm, and a length d2 of 6.8 mm.

The blade holes 211 are spaced apart from the boundary of the heat radiation region 250 by a predetermined distance, and the predetermined distance may be in the range of 1 mm to 1.3 mm, preferably, may be 1.1 mm.

A distance w between the base pad 220 and the heat radiation region 250 may be determined depending on designs. When the distance 2 is 0, the base pad 220 may make contact with the heat radiation region 250.

As described above, the blades 420 are inserted into the blade holes 211 of the heat radiation circuit board 200 in which the heat radiation region 250 is defined.

In this case, the boundary of the bottom surface 410 of the inserted heat radiation member 400 is soldered so that the heat radiation member 400 can be firmly attached to the heat radiation circuit board 200. Alternately, after the heat radiation member 400 has been inserted into the blade holes 211, the heat radiation member 400 may be attached to the heat radiation circuit board 200 through a plating process.

When a surface of the heat radiation circuit board 200, on which the heat emission device 300 is mounted, is defined as a top surface of the heat radiation circuit board 200, and when the heat radiation region 250 is defined on the top surface similarly to the base pad 220 on which the heat emission device 300 is mounted, the bottom surface 410 of the heat radiation member 400 is provided on the top surface, and the blades 420 are inserted in such a manner that the blades 420 protrude toward the rear surface of the heat radiation circuit board 200.

Therefore, the heat emitted from the heat emission device 300 may be discharged to the rear surface of the heat radiation circuit board 200 through the blades 420.

In the heat emission device package 100, after the heat emission device 300 has been mounted on the base pad 210 of the heat radiation circuit board and the heat radiation member 400 has been mounted, the heat emission device 300 and the heat radiation member 400 may be fixed onto the heat radiation circuit board through soldering.

Regarding the mounting of the heat radiation member 400, the heat radiation member 400 is mounted by applying an epoxy-based adhesive on the central island 235.

Next, after the adhesive has been heated and hardened, the heat radiation member 400 may be fixed by performing the soldering process.

In this case, the soldering process may be performed by performing a wave soldering process, and the process of mounting the heat radiation member 400 may be performed through an automatic insertion process.

To this end, the heat radiation members 400 may be reel-pocket-packed.

Hereinafter, the second embodiment will be described.

Referring to FIG. 5, a heat emission device package 100A according to the second embodiment includes the heat radiation circuit board 200, the heat emission device 300 on the heat radiation circuit board 200 and the heat radiation member 400.

The heat emission device 300 includes a device to emit heat in driving, and may be a light emitting device such as a light emitting diode or a power device to generate power.

On the heat radiation circuit board 200, a plurality of heat emission devices 300 may be provided, and the heat radiation member 400 is provided in adjacent to each heat emission device 300.

The heat radiation member 400 according to the second embodiment has the same shape as that of the heat radiation member 400 shown in FIG. 3.

The heat radiation circuit board 200 is a printed circuit board, and includes the insulting plate 210, the base pad 220 connected with a circuit pattern formed on the insulating plate 210 and the solder resist 230 to cover the circuit pattern.

In this case, the heat radiation region 250 of FIG. 5 is defined on the rear surface of the heat radiation circuit board 200.

Although the configuration of the heat radiation region 250 is the same as that shown in FIG. 4, the heat radiation region 250 is formed on a surface opposite to the surface for the base pad, so that the heat radiation member may be coupled in opposition to that shown in FIG. 2.

In other words, when the surface on which the heat emission device 300 is mounted is defined as the top surface of the heat radiation circuit board 200, the heat radiation region 250 is defined on a rear surface opposite to the based pad 220 on which the heat emission device 300 is mounted, so that the bottom surface 410 of the heat radiation member 400 is provided on the rear surface.

Therefore, the blades 420 are inserted in such a manner that the blades 420 protrude to the top surface of the heat radiation circuit board 200, so that the heat emitted from the heat emission device 300 may be discharged to the top surface of the heat radiation circuit board 200 through the blades 420.

In the case of a double-sided circuit board in which circuits are formed at both sides of the heat radiation circuit board 200, the blades 420 protrude in the same direction as that of the heat emission device 300, so that the heat emitted from the heat emission device 300 is discharged upward of the heat emission device 300 through the blades 420. Accordingly, the length of the blades 420 is formed higher than the height of the heat emission device 300, so that the convection effect is preferably maximized.

Regarding the mounting of the heat radiation member 400, solder paste is applied onto the heat radiation region 250 and the heat radiation member 400 is mounted on the heat radiation region 250.

Next, the heat radiation member 400 may be fixed by performing a soldering process.

In this case, the soldering process may be performed by performing a reflow soldering process, and the process of mounting the heat radiation member 400 may be performed through an automatic insertion process.

To this end, the heat radiation members 400 may be reel-pocket-packed.

Hereinafter, various application examples of the heat radiation member of FIG. 3 will be described with reference to FIG. 6.

Referring to FIG. 6a, a heat radiation member 400A according to the first application example includes two blades 430 bent from two sides of a bottom surface 410 and two sub-blades 440 bent from remaining sides adjacent to the two sides of the blades 430.

The sub-blades 440 have widths narrower than those of the remaining sides of the bottom surface 410 so that the sub-blades 440 are spaced apart from the blades 430.

In other words, the sub-blades 440 are bent with widths narrower than those of the remaining sides of the bottom surface 410.

Although the sub-blades 440 may have the length equal to that of the blades 430, the sub-blades 440 may be formed with a length long than that of the blades 430.

Referring to FIG. 6b, a heat radiation member 400B according to the second application example includes two blades 450 bent from two sides of the bottom surface 410, and the blades 450 have wing members 455 bent after extending perpendicularly to the bottom surface 410.

The blade member 455 is bent toward the outside in such a manner that the blade member 455 may be formed in parallel to the bottom surface 410. Preferably, the blade 450 may be perpendicular to the bottom surface 410, and the blade 450 may be perpendicular to the blade member 455.

Meanwhile, referring to FIG. 6c, a heat radiation member 400c according to the third application example includes two blades 450 bent from two sides of the bottom surface 410 and two sub-blades 440 bent from remaining sides adjacent to the two side of the blade 450.

The sub-blades 440 have widths narrower than widths of the remaining sides of the bottom surface 410 so that the sub-blades 440 are spaced apart from the blades 450.

In other words, the sub-blades 440 are bent with widths narrower than widths of the remaining sides of the bottom surface 410.

Meanwhile, the blades 450 have the blade members 455 which are bent after extending perpendicularly to the bottom surface 410.

Each blade member 455 may be bent out of the bottom surface 410 so that the blade member 455 does not face the bottom surface 410, and formed in parallel to the bottom surface 410. Preferably, the blades 450 are perpendicular to the bottom surfaces 410, and perpendicular to the blade member 455.

The length of the sub-blade 440 may be equal to that of a portion of the blade 450 perpendicular to the bottom surface 410.

Although the above description has been made in that the heat radiation member 400 has various shapes, the embodiment is not limited thereto.

The shapes and the number of the blade holes 211 in the heat radiation region 250 of the heat radiation circuit board 200 are varied depending on the shapes of the heat radiation members of FIGS. 6a to 6c.

Hereinafter, a heat emission device package according to the third embodiment will be described with reference to FIGS. 7a and 7b.

FIG. 7a is a perspective view showing the heat emission device package according to the third embodiment when viewed from the top, and FIG. 7b is a perspective view showing the heat emission device package according to the third embodiment when viewed from the bottom.

Referring to FIGS. 7a and 7b, a heat emission device package 100B according to the third embodiment includes the heat radiation circuit board 200, the heat emission device 300 on the heat radiation circuit board 200 and a heat radiation member 400D.

The heat emission device 300 includes a device to emit heat in driving, and may be a light emitting device such as a light emitting diode or a power device to generate power.

On the heat radiation circuit board 200, a plurality of heat emission devices 300 may be provided, and each of heat radiation members 400D is provided corresponding to each of the heat emission device 300.

The heat radiation member 400D has a bending surface and includes a metallic material.

The heat radiation member 400D may include steels such as SPCC, or EGI or an alloy material including Cu representing high thermal conductivity and a low price. In addition, the heat radiation member 400 may include metal allowing plating or soldering.

The heat radiation member 400D may be formed on the surface thereof with a plating layer, and the plating layer may include a metallic material, such as copper/zinc or copper/nickel, allowing soldering.

The heat radiation member 400D includes a bottom surface 410 and two blades 460 bent from both sides of the bottom surface 410 while facing each other.

The heat radiation member 400D has the thickness in the range of 0.3 mm to 0.6 mm, and, preferably, the heat radiation member 400D has the thickness of 0.5 mm.

The bottom surface 410 may have the shape of a square, preferably, the shape of a rectangle. In detail, the bottom surface 410 may have the shape of a rectangle having a length of 8 mm at one side and a length of 6 mm at another side.

The bottom surface 410 is provided on a rear surface of the heat radiation circuit board 200, that is, on an opposite surface to the top surface on which the heat emission device 300 is provided. The bottom surface 410 is aligned in line with the heat emission device 300 to directly discharge heat radiated from the heat emission device 300.

In this case, two blades 460 bent from two long sides of the bottom surface 410 may have the lengths in the range of 7 mm to 8 mm. Preferably, the two blades 460 may have the lengths of 7.8 mm.

The bending sides between the bottom surface 410 and the blades 460 may have a curvature.

Meanwhile, the heat radiation member 400D includes a heat radiation fin 466 bent in a direction opposite to that of the blade 460.

The heat radiation fin 466 is bent from another side adjacent to one side of the bottom surface 410 from which the blade 460 is bent.

The heat radiation fin 466 is formed with a predetermined width at the central portion of another side of the blade 460, and the width has the range similar to that of the thickness of the heat radiation member 400D.

The heat radiation fin 466 protrudes to the top surface of the heat radiation circuit board 200 through the blade hole 211 of the heat radiation circuit board 200, and the length of the heat radiation fin 466 may be equal to that of the blade 460.

Meanwhile, the blade 460 is bent while extending to the top surface of the heat radiation circuit board 200.

The blade 460 has a bending member 465 formed with a predetermined size around the bending side between the blade 460 and the bottom surface 410.

The bending member 465 extends with a predetermined width from the bending side, and bent in the direction opposite to that of the blade 410. The bending member 465 is cut out of the blade 460 and bent from the blade 460, so that the blade 460 is provided therein with a hole 467 having the same shape as that of the bending member 465.

The bending member 465 protrudes to the rear surface of the heat radiation circuit board 200 through the blade hole 211 formed in the heat radiation region 250 of the heat radiation circuit board 200. The length of the bending member 465 is short than that of the heat radiation fin 466, and the width of the bending member 465 is wider than that of the heat radiation fin 466.

As described above, in the heat radiation member 400D, the blade 460 is bent to the rear surface of the heat radiation circuit board 200 while a portion of the blade 460 is bent to the top surface of the heat radiation circuit board 200. Accordingly, the coupling force between the blade 460 and the heat radiation circuit board 200 is increased while heat is radiated up and down along the axis perpendicular to the heat emission device 300.

The heat radiation circuit board 200 serves as a printed circuit board. As shown in FIG. 2, the heat radiation circuit board 200 includes the insulating plate 210, the base pad 220 connected with the circuit pattern formed on the insulating plate 210 and the solder resist 230 to cover the circuit pattern.

In the heat radiation circuit board 200, heat radiation regions 256 are defined in the top surface where the heat emission device is provided and the rear surface opposite to the top surface.

The heat radiation region 250 has a shape corresponding to that of the bottom surface 410 of the heat radiation member 400. Preferably, the heat radiation region 250 has the shape of a rectangle, that is, the shape similar to that shown in FIG. 4.

The number and the shape of the blade holes 211 of the heat radiation region 250 are determined depending on the shape and the number of heat radiation fins 466 and the bending member 465 of the heat radiation member 400D.

The mounting of the heat radiation member 400D is performed by automatically inserting the heat radiation member 400D, bending the heat radiation fin 466, and fixing the heat radiation member 400D onto the heat radiation circuit board 200.

Next, a soldering process is performed. The soldering process may be performed by performing a wave soldering process. In order to more firmly fix the heat radiation member 400D onto the heat radiation circuit board 200, fixing ribs are provided at both lateral surfaces of the heat radiation fin 466 to reinforce the heat radiation fin 466.

To this end, a plurality of heat radiation members 400D may be reel-pocket-packed. In addition, the heat radiation member 400D may be packed after taping both ends of the bending member 465.

Hereinafter, a heat emission device package according to the fourth embodiment will be described with reference to FIGS. 8a and 8b.

FIG. 8a is a perspective view showing the heat emission device package according to the fourth embodiment when viewed from the top, and FIG. 8b is a perspective view showing the heat emission device package according to the fourth embodiment when viewed from the bottom.

Referring to FIGS. 8a and 8b, the heat emission device package 100C according to the fourth embodiment includes the heat radiation circuit board 200, the heat emission device 300 on the heat radiation circuit board 200, and a heat radiation member 400E.

The heat emission device 300 includes a device to emit heat in driving, and may be a light emitting device such as a light emitting diode or a power device to generate power.

On the heat radiation circuit board 200, a plurality of heat emission devices 300 may be provided, and the heat radiation member 400E is provided on a surface opposite to the surface for the heat emission device 300.

The heat radiation member 400E includes a metallic material and has a bending surface.

The heat radiation member 400E may include steels such as SPCC, or EGI or an alloy material including Cu representing high thermal conductivity and a low price. In addition, the heat radiation member 400 may include metal allowing plating or soldering.

The heat radiation member 400E may be provided on the surface thereof with a plating layer, and the plating layer may include a metallic material, such as copper/zinc or copper/nickel, allowing soldering.

The heat radiation member 400E includes the bottom surface 410 and a lateral surface 470 bent from one side of the bottom surface 410.

The heat radiation member 400E has the thickness in the range of 0.3 mm to 0.6 mm, and, preferably, the heat radiation member 400E has the thickness of 0.5 mm.

The bottom surface 410 may have the shape of a square, preferably, the shape of a rectangle. In detail, the bottom surface 410 may have the shape of a rectangle having the length of 8 mm at one side and the length of 6 mm at another side.

The bottom surface 410 is provided on a rear surface of the heat radiation circuit board 200, that is, on an opposite surface to the top surface on which the heat emission device 300 is provided. The bottom surface 410 is aligned in line with the heat emission device 300 to directly discharge heat radiated from the heat emission device 300.

The lateral surface 470 is bent perpendicularly to the bottom surface 410. The lateral surface 470 may be overlapped with the heat emission device 300.

The length of the lateral surface 470 is long than the length of the bottom surface 410 to form the shape of a rectangle.

The lateral surface 470 may include a top surface 473 bent from a short side so that the top surface 473 faces the bottom surface 410, and the area of the top surface 473 may be equal to that of the bottom surface 410.

The lateral surface 470 includes two blades 471 bent from two long sides adjacent to the short side while being parallel to each other.

The blade 471 may have the length equal to that of the top surface 473. The blade 471 is designed to have a width narrower than the length of the long side of the lateral surface 470 so that the bottom surface 410 is spaced apart from the top surface 473.

In this case, the bottom surface 410 further includes heat radiation fins 476 protruding to the top surface of the heat radiation circuit board 200 through the blade hole 211 of the heat radiation circuit board 200.

The heat radiation fins 476 are bent from both edges of the bending sides of the bottom surface 410, and have the width in the range similar to that of the thickness of the heat radiation member 400E.

The length of the heat radiation fin 476 may be equal to the length of the lateral surface 470.

As described above, in the heat radiation member 400E, the lateral surface 470 protrudes to the rear surface of the heat radiation circuit board 200 and a plurality of blades 471 bent from all sides of the lateral surface 470 while extending are formed, thereby improving the heat radiation efficiency.

As shown in FIG. 2, the heat radiation circuit board 200 includes the insulating plate 210, the base pad 220 connected with the circuit pattern formed on the insulating plate 210 and the solder resist 230 to cover the circuit pattern.

In the heat radiation circuit board 200, the heat radiation regions 250 are defined on the top surface wherein the heat emission device is provided and the rear surface opposite to the top surface.

The heat radiation region 250 has a shape corresponding to that of the bottom surface 410 of the heat radiation member 400E. Preferably, the heat radiation region 250 has the shape of a rectangle, that is, the shape similar to that shown in FIG. 4.

In this case, the number and the shape of the blade holes 211 of the heat radiation region 250 are determined depending on the shape and the number of heat radiation fins 466 of the heat radiation member 400E.

The mounting of the heat radiation member 400E is performed by automatically inserting the heat radiation member 400E, bending the heat radiation fin 476, and fixing the heat radiation member 400E onto the heat radiation circuit board 200.

Next, the soldering process is performed. The soldering process may be performed through the wave soldering process.

To this end, a plurality of heat radiation members 400E may be reel-pocket-packed. In addition, the heat radiation member 400E may be packed after taping and punching both ends of the bending member 465.

Hereinafter, the effect of the embodiment will be described.

The heat radiation effect is represented by about −3.5° C. when the heat emission device of FIG. 9a is attached to the heat sink, and represented by about −1.5° C. when the heat emission device is packaged without the heat sink.

In this case, the heat radiation effect is represented by −2° C. when a circuit pattern is optimized in the packing to improve the heat radiation efficiency, and represented by −3.5° C. when the soldering area is enlarged in packaging.

In addition, the heat radiation effect may be represented by −1.5° C. when the metallic plate is attached in adjacent to the heat emission device.

On the contrary, when the heat radiation member according to the embodiment is inserted, the heat radiation effect is represented by −10° C. Accordingly, the heat radiation efficiency can be improved by forming the heat radiation member having the structure and providing the heat radiation member in adjacent to the heat emission device.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A heat radiation member comprising:
a bottom plate disposed on a circuit board;
blades bent from side ends of the bottom plate while facing each other;
heat radiation fins bent in a direction opposite to that of the blades; and
a first bending member formed with a predetermined size around a bending side between the blades and the bottom plate,
wherein the first bending member is spaced apart from the heat radiation fins,
wherein the heat radiation fins are bent from other side ends adjacent to the side ends of the bottom plate from which the blades are bent,
wherein the blades are bent while extending to a top surface of the circuit board,
wherein the heat radiation fins protrude to a bottom surface of the circuit board,
wherein the first bending member extends with a predetermined width from the bending side and is bent in the direction opposite to that of the blades,
wherein the first bending member protrudes to the bottom surface of the circuit board, and
wherein the heat radiation fins and the first bending member pass through the circuit board.

2. The heat radiation member of claim 1, wherein the bottom plate has a shape of a rectangle.

3. The heat radiation member of claim 2, further comprising a second bending member bent to an outside from the blades.

4. The heat radiation member of claim 3, wherein the second bending member is parallel to the bottom plate.

5. The heat radiation member of claim 1, wherein the bottom plate is brought into direct contact with the top surface of the circuit board.

6. A heat radiation circuit board comprising:
a printed circuit board in which a heat radiation region is defined; and
a heat radiation member inserted into the heat radiation region and comprising a bottom plate attached to the heat radiation region, blades bent from the bottom plate while facing each other to pass through the printed circuit board, heat radiation fins bent in a direction opposite to that of the blades, and a first bending member formed with a predetermined size around a bending side between the blades and the bottom plate,
wherein a solder resist is open in a peripheral portion of the heat radiation region of the printed circuit board,
wherein the heat radiation region is provided at a central portion thereof with a central island in which the solder resist remains,
wherein the bottom plate of the heat radiation member is brought into direct contact with the central island,
wherein the first bending member is spaced apart from the heat radiation fins,
wherein the heat radiation fins are bent from other side ends adjacent to the side ends of the bottom plate from which the blades are bent,
wherein the blades are bent while extending to a top surface of the circuit board,
wherein the heat radiation fins protrude to a bottom surface of the circuit board,
wherein the first bending member extends with redetermined width from the bending side and is bent in the direction opposite to that of the blades,
wherein the first bending member protrudes to the bottom surface of the circuit board, and
wherein the heat radiation fins and the first bending member pass through the circuit board.

7. The heat radiation circuit board of claim 6, wherein:
the heat radiation region comprises a plurality of heat radiation holes, and
the heat radiation fins and the first bending member of the heat radiation member pass through the heat radiation holes.

8. The heat radiation circuit board of claim 7, wherein the heat radiation region has an area larger than an area of the bottom plate of the heat radiation member.

9. A heat emission device package comprising:
a heat emission device;
a printed circuit board mounted thereon with the heat emission device and having a heat radiation region defined around the heat emission device; and
a heat radiation member inserted into the heat radiation region and comprising a bottom plate attached to the heat radiation region, blades bent from the bottom plate to pass through the printed circuit board, heat radiation fins bent in a direction opposite to that of the blades, and a first bending member formed with a predetermined size around a bending side between the blades and the bottom plate,
wherein a solder resist is open in a peripheral portion of the heat radiation region of the printed circuit board,
wherein the heat radiation region is provided at a central portion thereof with a central island in which the solder resist remains,
wherein the bottom plate of the heat radiation member is brought into direct contact with the central island,
wherein the first bending member is spaced apart from the heat radiation fins,
wherein the heat radiation fins are bent from other side ends adjacent to the side ends of the bottom plate from which the blades are bent,
wherein the blades are bent while extending to a top surface of the circuit board,
wherein the heat radiation fins protrude to a bottom surface of the circuit board,
wherein the first bending member extends with a predetermined width from the bending side and is bent in the direction opposite to that of the blades,
wherein the first bending member protrudes to the bottom surface of the circuit board, and
wherein the heat radiation fins and the first bending member pass through the circuit board.

* * * * *